United States Patent
Chou

(10) Patent No.: US 7,417,926 B2
(45) Date of Patent: Aug. 26, 2008

(54) DETECTOR FOR DETECTING INFORMATION CARRIED BY A SIGNAL HAVING A SAWTOOTH-LIKE SHAPE

(75) Inventor: Yu-Kai Chou, Kao Hsiung (TW)

(73) Assignee: Mediatek Inc., Hsin Chu (TW)

( * ) Notice: Subject to any disclaimer, the term of this patent is extended or adjusted under 35 U.S.C. 154(b) by 714 days.

(21) Appl. No.: 10/958,415

(22) Filed: Oct. 6, 2004

(65) Prior Publication Data
US 2005/0078589 A1   Apr. 14, 2005

(30) Foreign Application Priority Data
Oct. 8, 2003  (TW) .............................. 92128013 A

(51) Int. Cl.
*G11B 5/09* (2006.01)
(52) U.S. Cl. .................. 369/47.22; 369/47.31
(58) Field of Classification Search ............... None
See application file for complete search history.

(56) References Cited

U.S. PATENT DOCUMENTS 6,608,810 B2 * 8/2003 Minamino et al. ....... 369/275.4
6,765,959 B1 * 7/2004 Tanaka et al. ............. 375/239
2005/0050406 A1 * 3/2005 Hsu .......................... 714/701

* cited by examiner

*Primary Examiner*—Joseph Feild
*Assistant Examiner*—Joseph Haley
(74) *Attorney, Agent, or Firm*—Muncy, Geissler, Olds & Lowe, PLLC

(57) ABSTRACT

A detector for detecting information carried by a wobble signal having a sawtooth-like shape with a base frequency of $f_{wob}$. The detector includes a first band-pass filter having a center frequency close to $2*f_{wob}$ for filtering the wobble signal and generating a first filtered signal, a second band-pass filter having the center frequency close to $f_{wob}$ for filtering the wobble signal and generating a second filtered signal, first and second comparators for respectively comparing the first and second filtered signal with a reference voltage and generating first and second compared signals, a delay unit for delaying the second compared signal by a time period, and then outputting a delayed signal, and a sampling unit for sampling the first compared signal using the delayed signal as a sampling clock, and for outputting a sampled value representing the information carried by the sawtooth wobble.

24 Claims, 11 Drawing Sheets

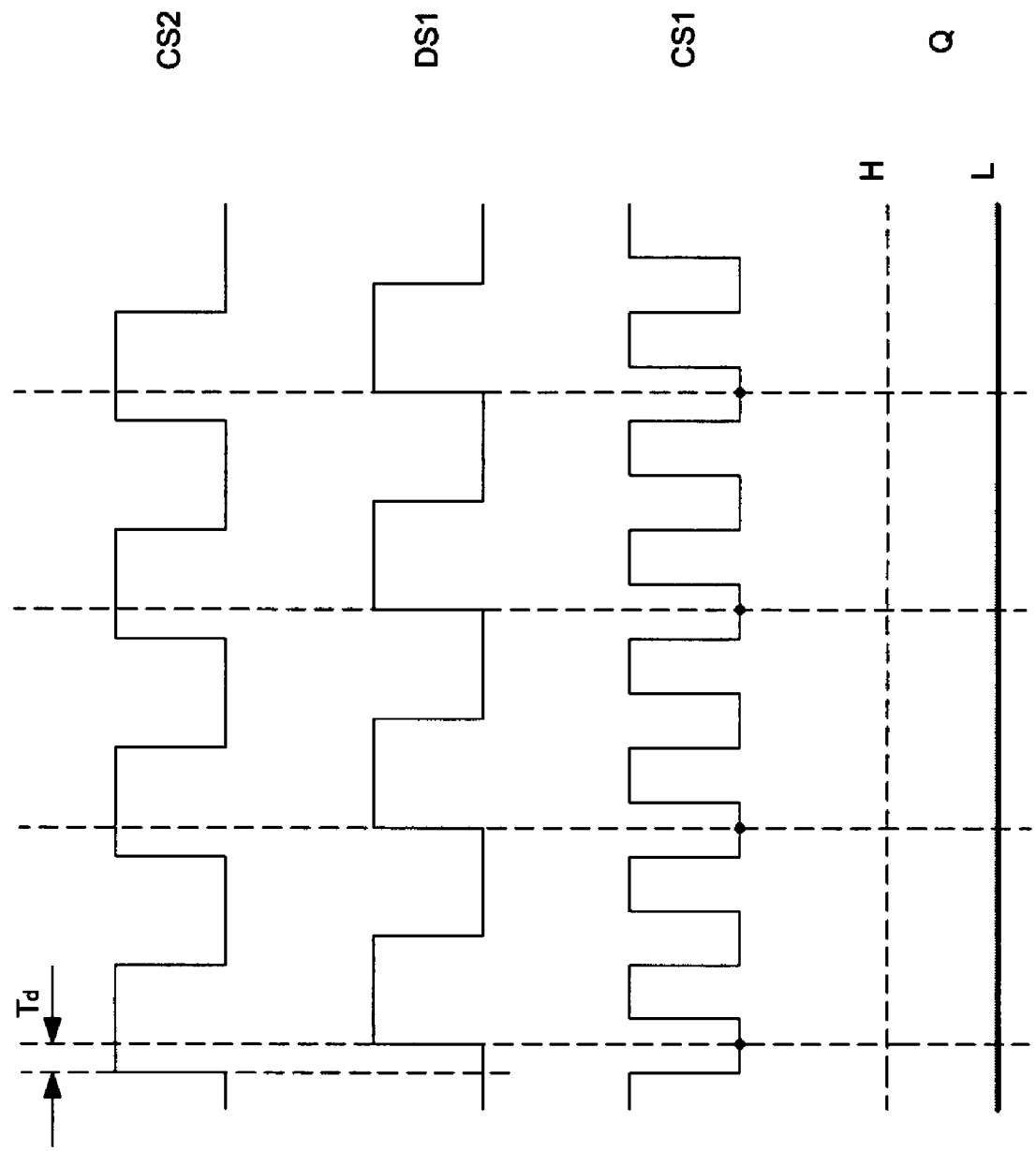

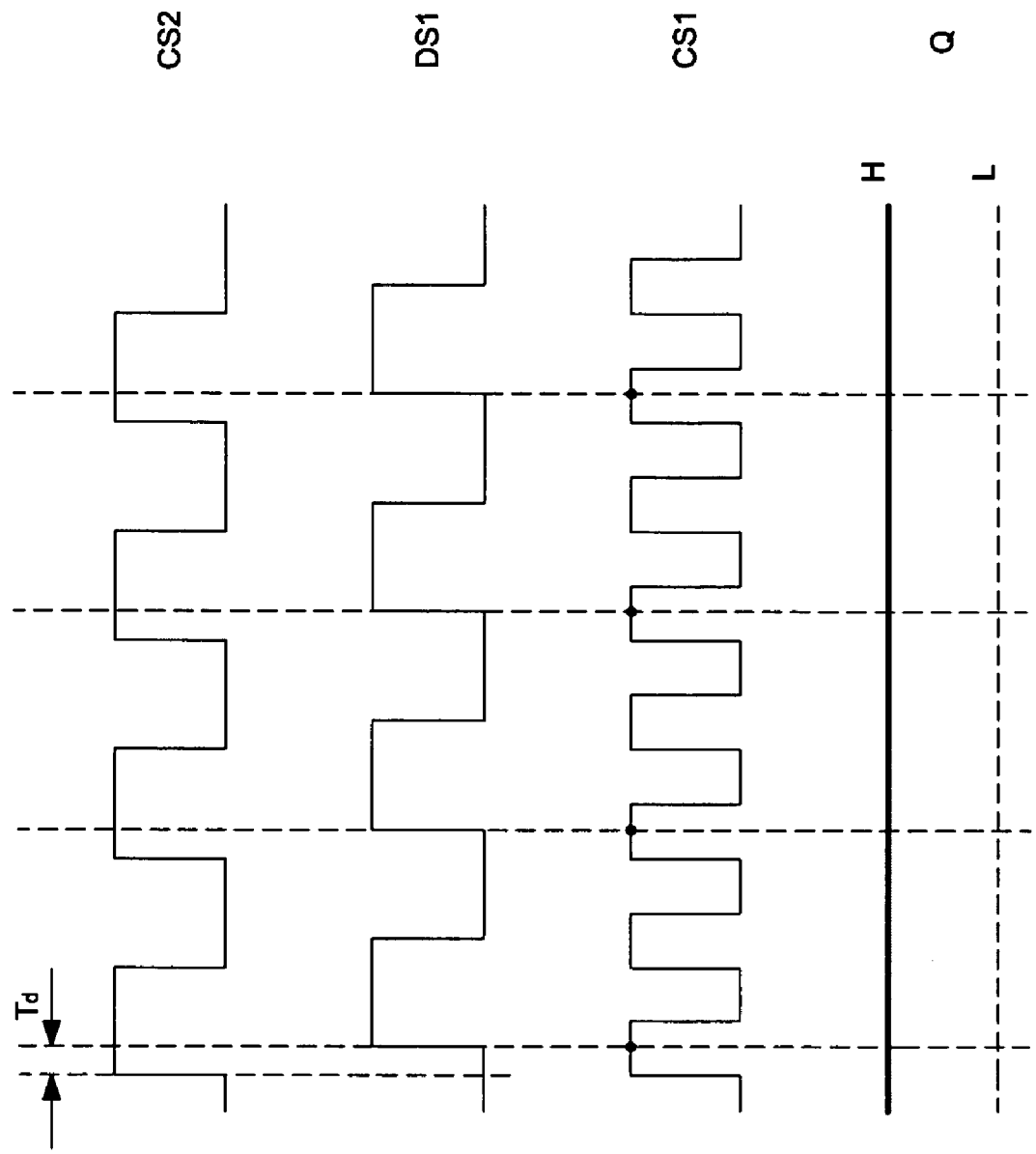

… (1) …

DETECTOR FOR DETECTING INFORMATION CARRIED BY A SIGNAL HAVING A SAWTOOTH-LIKE SHAPE

This application claims the benefit of the filing date of Taiwan Application Ser. No. 092128013, filed Oct. 8, 2003, the content of which is incorporated herein by reference.

BACKGROUND

The invention relates to a detector for detecting information carried by signal having a sawtooth-like shape.

Along with advances in optical disc technologies, a new generation of the optical disc rewritable format that is defined as the Blu-Ray has been developed. The track groove in the Blu-Ray optical disc has a wobble shape, and the basic wobble pattern of the track groove is a sine/cosine wave. In the Blu-Ray optical disc, one nominal wobble length (referred to as NWL hereinafter) is equivalent to 69 channel bits, which is the minimum record unit of the Blu-Ray optical disc.

The basic pattern of the wobble is a cosine wave: $\cos\{2\pi * f_{wob} * t\}$, where $f_{wob}$ denotes the basic frequency of the wobble. Wobbles in this basic shape are called "Monotone Wobbles" (MW). In addition, some wobbles are modulated in order to carry the address information which are referred to as the ADIP (Addresses in Pre-groove), of some record units on the disc, wherein two modulation methods are involved. The first modulation method is the minimum shift keying—cosine variant (referred to as MSK-cos hereinafter), and the second method is the harmonic modulated wave (referred to as HMW hereinafter).

FIG. 1 shows the definition of the MSK mark (referred to as MM hereinafter). As shown in FIG. 1, one MSK mark consists of three NWLs with the following wobble patterns:

a first NWL starts MSK mark with a cosine wobble with a frequency $1.5 * f_{wob}$, and is given by $\cos\{2\pi*(1.5*f_{wob})*t\}$;

a second NWL continues the MSK mark with a cosine wobble with a frequency $f_{wob}$, and is given by $-\cos\{2\pi*f_{wob}*t\}$; and a third NWL terminates the MSK mark with a cosine wobble with a frequency $1.5*f_{wob}$, and is given by $-\cos\{2\pi*(1.5*f_{wob})*t\}$.

FIG. 2 shows the definition of the sawtooth wobble (referred to as STW hereinafter), which is a wobble having a sawtooth-like shape. A STW is formed by combining the basic cosine wave and a sine wave of the double frequency and is given by:

$\cos\{2\pi*f_{wob}*t\} \pm a*\sin\{2\pi*(2*f_{wob})*t\}$ in which $a=0.25$.

Such a combination of a cosine signal with the basic frequency $f_{wob}$ and a weighted second harmonic signal forms a sawtooth-like waveform. The "+" or "−" sign creates the left or right inclination of the waveform, where the "+" sign is used to represent an information bit of logic one, while the "−" sign is used to represent an information bit of logic zero.

FIG. 3 shows the typical ADIP structure of the Blu-Ray optical disc. The data to be recorded onto the optical disc must be aligned with the ADIP addresses which are modulated in the wobble. As shown in FIG. 3, 56 NWLs correspond to two recording frames and each group of 56 NWLs is called an ADIP unit. Each recording frame includes 1932 channel bits containing a sync filed and a data field. Moreover, two adjacent ADIP units are separated by a recording frame having a period of about 9.5 wobble cycles.

FIG. 4 shows the format of an ADIP unit. As shown in FIG. 4, the following types of ADIP units are defined:

monotone unit: consisting of 1 MM followed by 53 MW;
reference unit: consisting of 1 MM followed by 15 MW, 37 STW, and 1 MW;
sync_0 unit: consisting of 1 MM followed by 13 MW, 1 MSK mark, 7 MW, 1 MM, and 27 MW;
sync_1 unit: consisting of 1 MM followed by 15 MW, 1 MSK mark, 7 MW, 1 MM, and 25 MW;
sync_2 unit: consisting of 1 MM followed by 17 MW, 1 MM, 7 MW, 1 MM, and 23 MW;
sync_3 unit: consisting of 1 MM followed by 19 MW, 1 MM, 7 MW, 1 MM, and 21 MW;
data_1 unit: consisting of 1 MM followed by 9 MW, 1 MM, 3 MW, 37 STW, and 1 MW; and
data_0 unit: consisting of 1 MM followed by 11 MW, 1 MM, 1 MW, 37 STW, and 1 MW.

Hence, the ADIP addresses on the optical disc are positioned according to the unit types of the above-mentioned ADIP unit. So, in order to judge the unit types of the ADIP unit correctly, it is an important subject to correctly judge whether the information bit carried by the STW is logic one or logic zero.

SUMMARY

In view of the above-mentioned problems, an object of the invention is to provide a detector for detecting information carried by a wobble signal having a sawtooth-like shape.

To achieve the above-mentioned object, the detector of the invention includes a first band-pass filter having a center frequency close to $2*f_{wob}$ for filtering the wobble signal and generating a first filtered signal, a second band-pass filter having a center frequency close to $f_{wob}$ for filtering the wobble signal and generating a second filtered signal, a first comparator for comparing the first filtered signal with a reference voltage and generating a first compared signal, a second comparator for comparing the second filtered signal with the reference voltage and generating a second compared signal, a delay unit for receiving the second compared signal, delaying the second compared signal by a time period, and then outputting a delayed signal, and a sampling unit for sampling the first compared signal using the delayed signal as a sampling clock, and outputting a sampled value representing the information bit carried by the wobble signal.

To achieve the above-mentioned object, the detector of the invention includes a first band-pass filter having a center frequency close to $2*f_{wob}$ for filtering the wobble signal and generating a first filtered signal, a second band-pass filter having a center frequency close to $f_{wob}$ for filtering the wobble signal and generating a second filtered signal, a first comparator for comparing the first filtered signal with a reference voltage and generating a first compared signal, a second comparator for comparing the second filtered signal with the reference voltage and generating a second compared signal, a delay unit for receiving the first compared signal, delaying the first compared signal by a time period, and then outputting a delayed signal, and a sampling unit for sampling the delayed signal using the second compared signal as a sampling clock, and outputting a sampled value representing the information bit carried by the wobble signal.

BRIEF DESCRIPTION OF THE DRAWINGS

FIGS. 6A to 6E are schematic illustrations showing the waveforms in the detector of the invention, wherein FIG. 6A shows the wobble signal, FIG. 6B shows the second filtered signal, FIG. 6C shows the second compared signal, FIG. 6D shows the first filtered signal, and FIG. 6E shows the first compared signal.

FIGS. 7A to 7D are schematic illustrations showing the waveforms in the detector in the FIG. 5 of the invention when the information bit is logic one, wherein FIG. 7A shows the second compared signal, FIG. 7B shows the signal delayed by the second compared signal, FIG. 7C shows the first compared signal, and FIG. 7D shows the sampled value reflecting the information bit.

FIGS. 8A to 8D are schematic illustrations showing the waveforms in the detector in the FIG. 5 of the invention when the information bit is logic zero, wherein FIG. 8A shows the second compared signal, FIG. 8B shows the signal delayed by the second compared signal, FIG. 8C shows the first compared signal, and FIG. 8D shows the sampled value reflecting the information bit.

FIGS. 10A to 10D are schematic illustrations showing the waveforms in the detector in the FIG. 9 of the invention when the information bit is logic one, wherein FIG. 10A shows the second compared signal CS2, FIG. 10B shows the first compared signal CS1, FIG. 10C shows the delayed signal DS1 obtained by delaying the first compared signal CS1 by a time period $T_d$, and FIG. 10D shows the sampled value Q output from the sampling unit.

FIGS. 11A to 11D are schematic illustrations showing the waveforms in the detector in the FIG. 9 of the invention when the information bit is logic zero, wherein FIG. 11A shows the second compared signal CS2, FIG. 11B shows the first compared signal CS1, FIG. 11C shows the delayed signal DS1 obtained by delaying the first compared signal CS1 by a time period $T_d$, and FIG. 11D shows the sampled value Q output from the sampling unit.

DETAILED DESCRIPTION

The detector for detecting information carried by signal having a sawtooth-like shape of the invention will be described with reference to the accompanying drawings.

Figure 1:
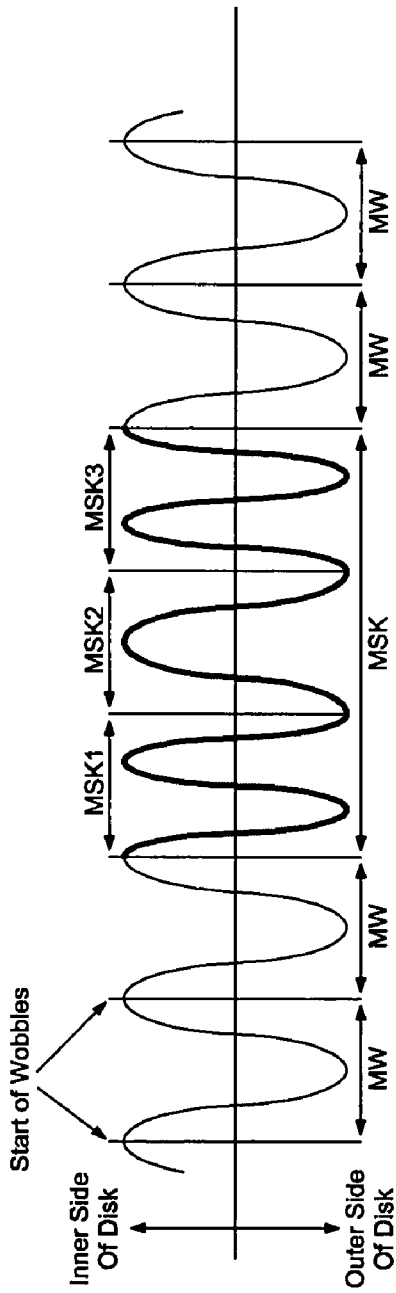
FIG. 1 shows the definition of the MSK mark.
Figure 2:
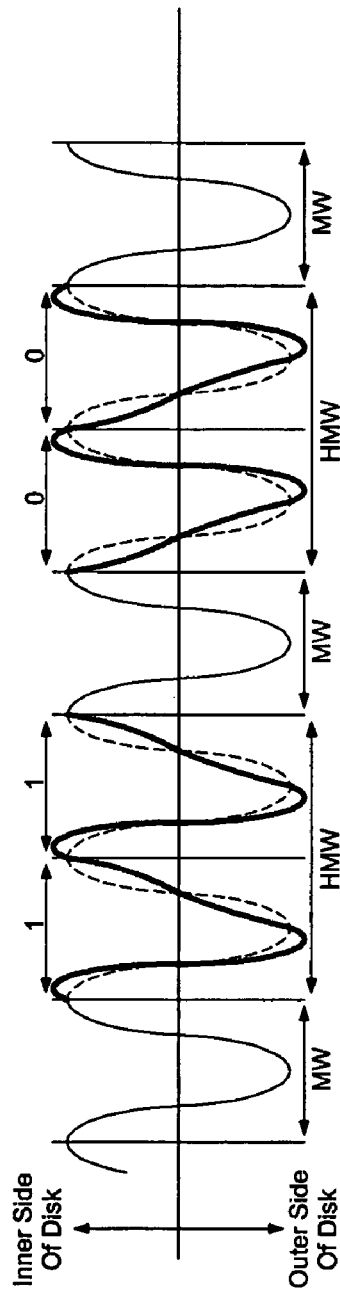
FIG. 2 shows the definition of the sawtooth wobble.
Figure 3:
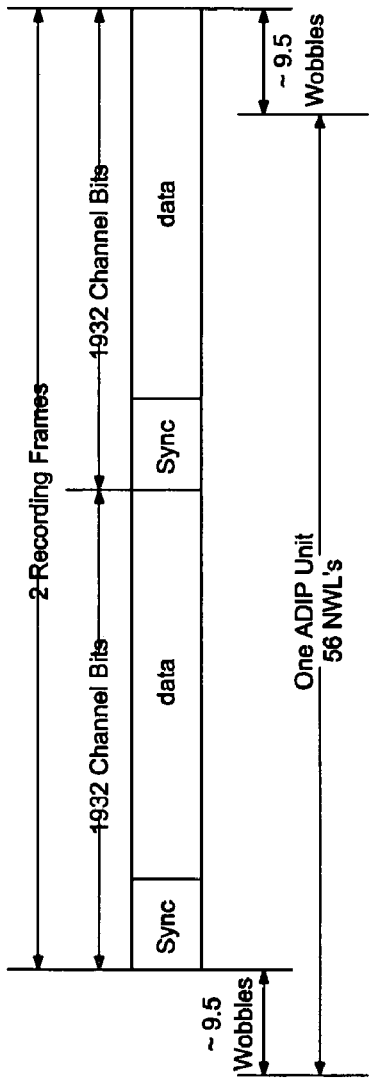
FIG. 3 shows the architecture of the ADIP information of the Blu-Ray optical disc.
Figure 4:
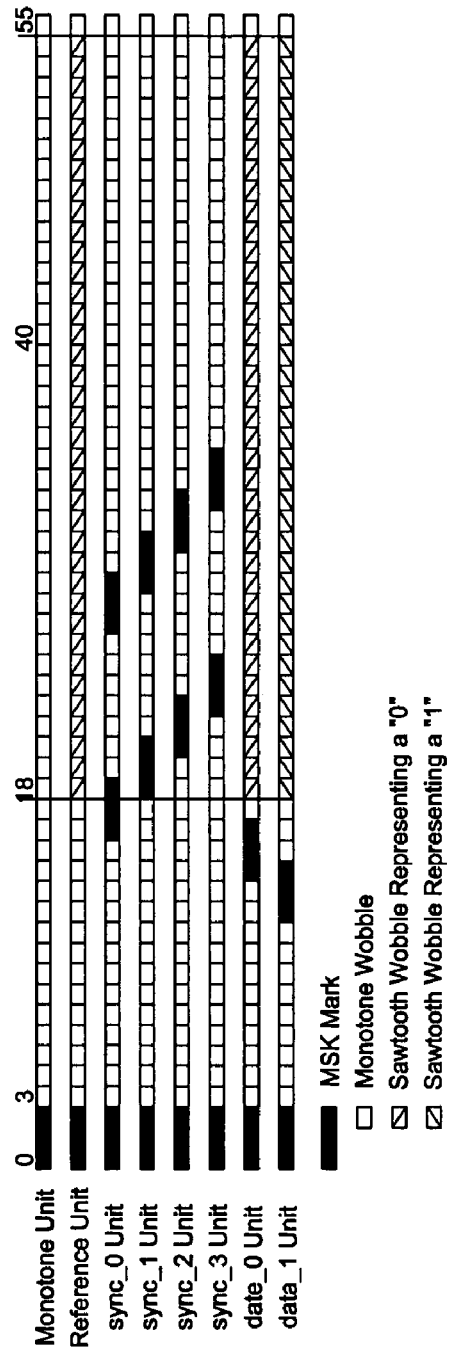
FIG. 4 shows the format of the ADIP unit.
Figure 5:
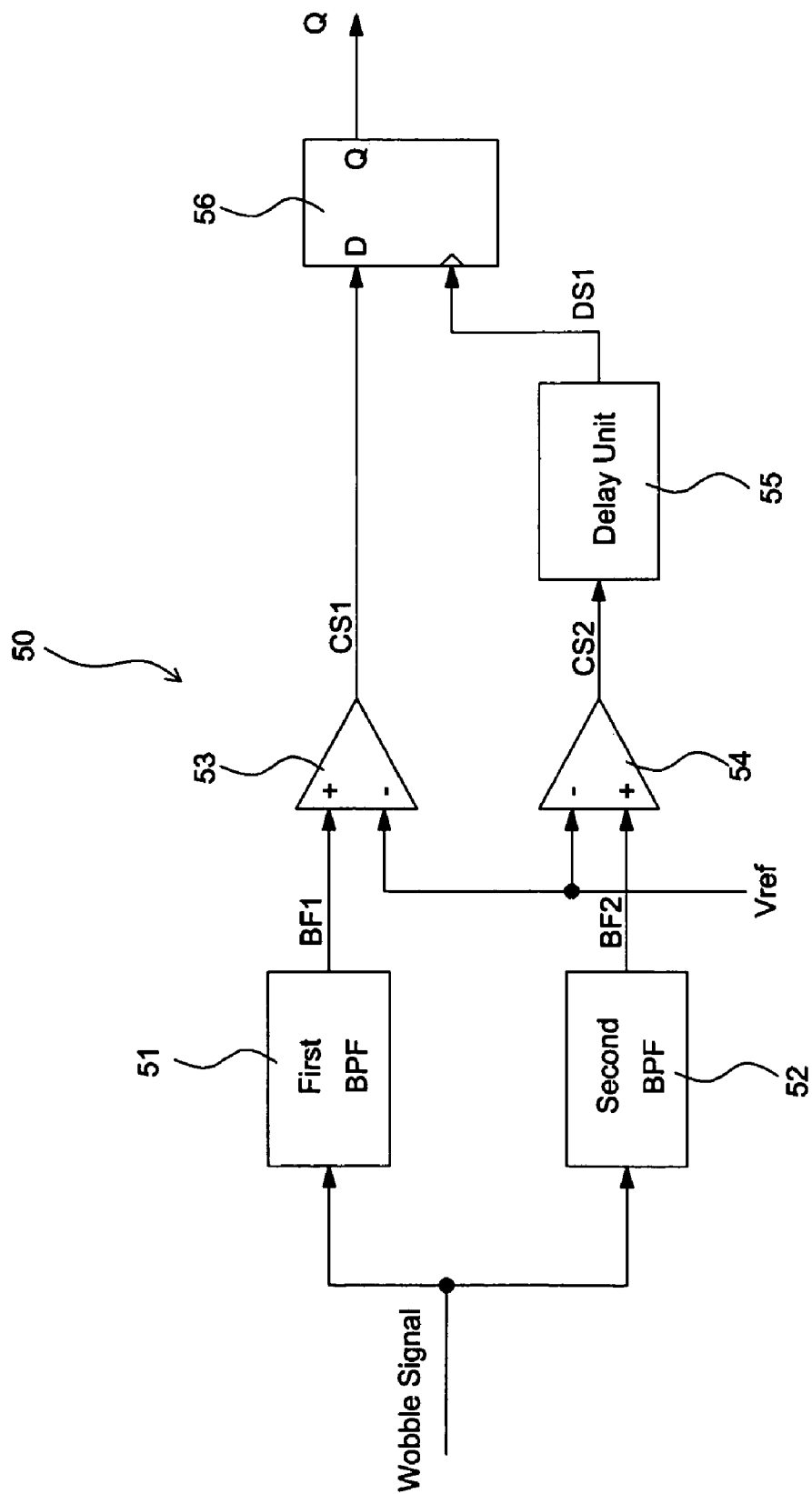
FIG. 5 shows the detector of a first embodiment for detecting information carried by a sawtooth wobble according to the invention.

FIG. 5 shows the detector of a first embodiment for detecting information carried by signal having a sawtooth-like shape according to the invention. Referring to the drawing, the detector 50 of the invention includes a first band-pass filter 51, a second band-pass filter 52, a first comparator 53, a second comparator 54, a delay unit 55, and a sampling unit 56.

The first band-pass filter 51 has a center frequency, substantially twice that of the base frequency $f_{wob}$ of the wobble signal in this embodiment, and generates a first filtered signal BF1. The second band-pass filter 52 has a center frequency, substantially equal to the base frequency $f_{wob}$ of the wobble signal in this embodiment, and generates a second filtered signal BF2. Hence, after the wobble signal passes through the first band-pass filter 51, the base frequency component is substantially filtered out and the double-frequency component is kept. Thus, the first filtered signal BF1 can be given by, $$BF1 = \pm a^* \sin\{2\pi^*(2^*f_{wob})^*t\}$$

wherein the "+" or "−" sign represents the polarity of the first filtered signal BF1.

On the other hand, after the wobble signal passes through the second band-pass filter 52, the double-frequency component is substantially filtered out and the base frequency component is kept. Thus, the second filtered signal BF2 can be given by, $$BF2 = \cos\{2\pi^* f_{wob}^* t\}$$

The first comparator 53 converts the first filtered signal BF1 into a square wave first compared signal CS1, and the second comparator 54 converts the second filtered signal BF2 into a square wave second compared signal CS2. For practical implementation, the first comparator 53 and the second comparator 54 could be a traditional comparator, a slicer, or the like such that when the level of the input signal is higher than a reference signal Vref, logic high, typically having a high voltage level, is outputted; or otherwise logic low, typically having a low voltage level, is outputted. The delay unit 55 receives the second compared signal CS2 and delays the second compared signal CS2 by a time period $T_d$ to generate a delayed signal DS1. Theoretically, the time period $T_d$ can be any positive number. For practical system, it is preferred that the time period $T_d$ is less than $1/f_{wob}$, and even preferred that $T_d$ equals to $N/(8^*f_{wob})$, where N is an odd integer. The sampling unit 56 samples the first compared signal CS1 using the delayed signal DS1 as a trigger signal, and outputs the sampled value Q which reflects the information bit carried by the sawtooth wobble signal. The sampling unit 56 may be a flip-flop, or other circuits that can provide the equivalent function.

It can be found that it is the first compared signal CS1 which reflects the information carried by the sawtooth wobble signal. To speak more specifically, the polarity of the first compared signal CS1 reflects the information carried by the sawtooth wobble signal. The polarity of the first compared signal CS1 can be detected based on the sampled value Q obtained by sampling the first compared signal CS1. The second compared signal SC2 is a good candidate of the sampling clock used for sampling the first compared signal SC1. However, as will be seen in FIG. 6C and 6E, due to the edges of the second compared signal SC2 are substantially aligned to that of the first compared signal CS1, the second compared signal SC2 is not suitable to be directly used as the sampling clock. In stead, the delayed signal DS1 obtained by delaying the second compared signal SC2 by a proper time period $T_d$ is a good sampling clock for sampling the first compared signal CS1. The sampling of the first compared signal SC1 can be performed based on either the rising or falling edges of the delayed signal DS1.

Figure 6A:
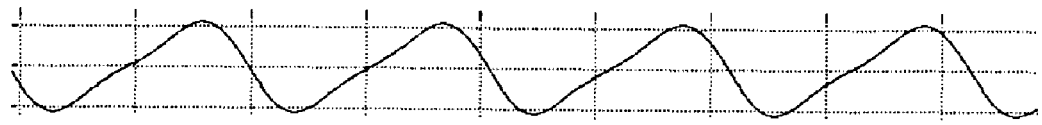
Figure 6B:
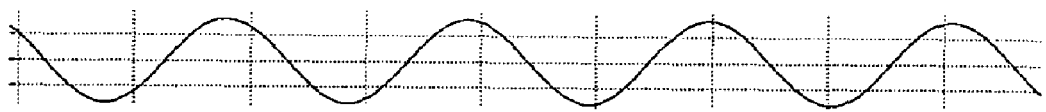
Figure 6C:
Figure 6D:
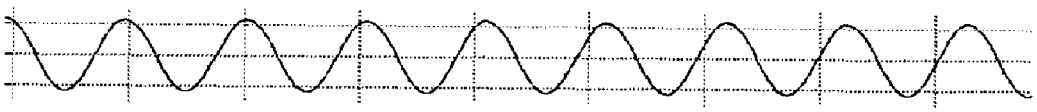
Figure 6E:

FIGS. 6A to 6E are schematic illustrations showing the waveforms in the detector in FIG. 5 of the invention, wherein FIG. 6A shows the sawtooth wobble signal, FIG. 6B shows the second filtered signal BF2, FIG. 6C shows the second compared signal CS2, FIG. 6D shows the first filtered signal BF1, and FIG. 6E shows the first compared signal CS1. As shown in FIG. 6A, the wobble signal is a rightward slanting sawtooth wobble, which indicates that the information bit carried by the sawtooth wobble is logic one. The second filtered signal BF2 of FIG. 6B is a cosine wave generated after the second band-pass filter 52 has filtered the wobble signal of FIG. 6A. The second compared signal CS2 of FIG. 6C is a square wave signal generated after the second filtered signal BF2 is sliced. So, as shown in FIG. 6C, the frequency of the second compared signal CS2 is substantially the base frequency $f_{wob}$. The first filtered signal BF1 of FIG. 6D is a sine wave generated after the first band-pass filter 51 has filtered the wobble signal of FIG. 6A. The first compared signal CS1 of FIG. 6E is a square wave generated after the first filtered signal BF1 of FIG. 6D is sliced. So, as shown in FIG. 6E, the frequency ($2*f_{wob}$) of the first compared signal CS1 is twice that of the base frequency $f_{wob}$.

FIGS. 7A to 7D are schematic illustrations showing the waveforms in the detector in FIG. 5 of the invention when the information bit carried by the wobble signal is logic one, wherein FIG. 7A shows the second compared signal CS2, FIG. 7B shows the delayed signal DS1 obtained by delaying the second compared signal CS2 by a time period $T_d$, FIG. 7C shows the first compared signal CS1, and FIG. 7D shows the sampled value Q output from the sampling unit. The time period $T_d$ in this example is $1/(8*f_{wob})$. In general, $T_d$ could be any positive number. Using the delayed signal DS1 as shown in FIG. 7B, the first compared signal CS1 can be properly sampled. From FIGS. 7B and 7C, no matter the sampling is performed based on the rising or falling edges of the delayed signal DS1, the sampled value Q output from the sampling unit could reflect the information bit carried by the wobble signal. In the example shown in FIGS. 7A to 7D wherein $T_d=1/(8*f_{wob})$, the sampled value Q is a low level voltage, which represents the information bit of logic one. However, if one lets $T_d=3/(8*f_{wob})$, say, it is easy to find that the sampled value Q will be a high level voltage, which represents the information bit of logic one in this case. Once the $T_d$ is determined, whether the sampled value Q of high or low level voltage represents the information bit of logic one is also determined. In result, the information carried by the wobble signal can be detected according to the invention.

FIGS. 8A to 8D are schematic illustrations showing the waveforms in the detector in FIG. 5 of the invention when the information bit carried by the wobble signal is logic zero, wherein FIG. 8A shows the second compared signal CS2, FIG. 8B shows the delayed signal DS1 obtained by delaying the second compared signal CS2 by a time period $T_d$, FIG. 8C shows the first compared signal CS1, and FIG. 8D shows sampled value Q of output from the sampling unit. The time period $T_d$ in this example is $1/(8*f_{wob})$. In general, $T_d$ could be any positive number. Similarly, using the delayed signal DS1 as shown in FIG. 8B, the first compared signal CS1 can be properly sampled. In the example shown in FIG. 8A to 8D wherein $T_d=1/(8*f_{wob})$, the sampled value Q is a high level voltage, which represents the information bit of logic zero. However, if one lets $T_d=3/(8*f_{wob})$, say, it is easy to find that the sampled value Q will be a low level voltage, which represents the information bit of logic zero in this case. Once the $T_d$ is determined, whether the sampled value Q of high or low level voltage represents the information bit of logic zero is also determined. In result, the information carried by the wobble signal can be detected according to the invention.

Followings are the steps of a first method for detecting information carried by a wobble signal having a sawtooth-like shape in the present invention. The wobble signal has a base frequency of $f_{wob}$. The method comprises:

Step S1202: generate a first filtered signal by band-pass filtering the wobble signal using a center frequency close to $2*f_{wob}$.

Step S1204: generate a second filtered signal by band-pass filtering the wobble signal using a center frequency close to $f_{wob}$.

Step S1206: generate a first compared signal by comparing the first filtered signal with a first reference voltage.

Step S1208: generate a second compared signal by comparing the second filtered signal with a second reference voltage. The first reference voltage and the second reference voltage may be substantially the same.

Step S1210: generate a delayed signal by delaying the second compared signal by a preset time period. The preset time period is less than $1/f_{wob}$ and equals to $N/(8*f_{wob})$, wherein N is an odd integer.

Step S1212: generate a sampled value representing the information carried by the wobble signal by sampling the first compared signal using the delayed signal as a sampling clock. The delayed signal can be sampled according to the rising edges or falling edges of the second compared signal to generate the sampled value.

Figure 9:
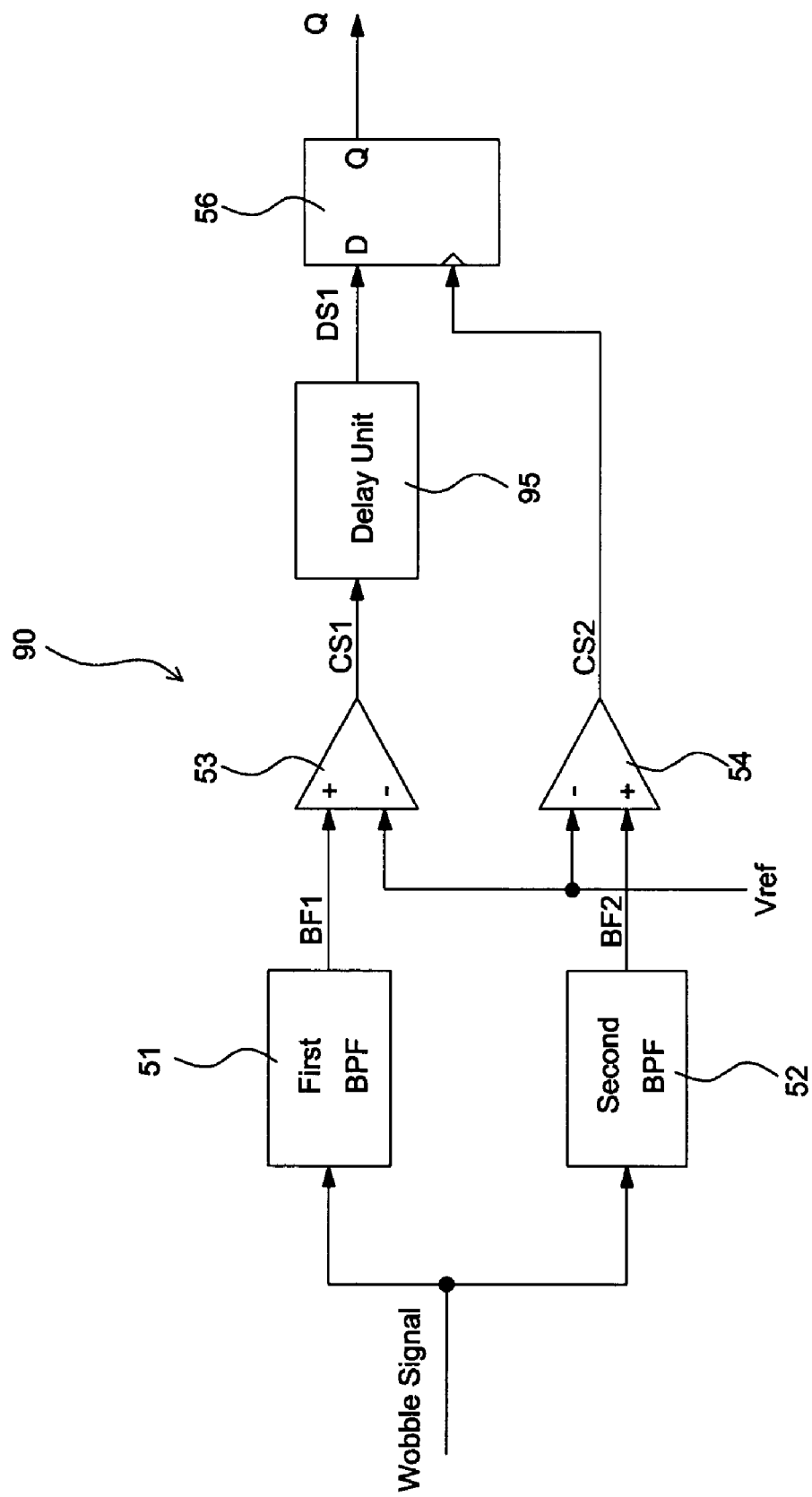
FIG. 9 shows the detector of a second embodiment for detecting information carried by a sawtooth wobble.

FIG. 9 shows the detector of a second embodiment for detecting information carried by signal having a sawtooth-like shape according to the invention. Referring to the drawing, the detector 90 of the invention includes a first band-pass filter 51, a second band-pass filter 52, a first comparator 53, a second comparator 54, a delay unit 95, and a sampling unit 56. The function and structure of the first band-pass filter 51, the second band-pass filter 52, the first comparator 53 and the second comparator 54 in FIG. 9 are same as those in FIG. 5, therefore the detail description are omitted.

The delay unit 95 receives the first compared signal CS1 and delays the first compared signal CS1 by a time period $T_d$ to generate a delayed signal DS1. Theoretically, the time period $T_d$ can be any positive number. For practical system, it is preferred that the time period $T_d$ is less than $1/f_{wob}$, and even preferred that $T_d$ equals to $N/(8*f_{wob})$, where N is an odd integer. The sampling unit 56 samples the delayed signal DS1 using the second compared signal CS2 as a trigger signal, and outputs the sampled value Q which reflects the information carried by the sawtooth wobble signal. The sampling unit 56 may be a flip-flop, or other circuits that can provide the equivalent function.

It can be found that it is the first compared signal CS1 which reflects the information carried by the sawtooth wobble signal. To speak more specifically, the polarity of the first compared signal CS1 reflects the information carried by the sawtooth wobble signal. The polarity of the first compared signal CS1 can be detected based on the sampled value Q obtained by sampling the delayed signal DS1 obtained by delaying the first compared signal CS1 by a time period $T_d$. The second compared signal SC2 is a good candidate of the sampling clock used for sampling the delayed signal DS1.

Figure 10:
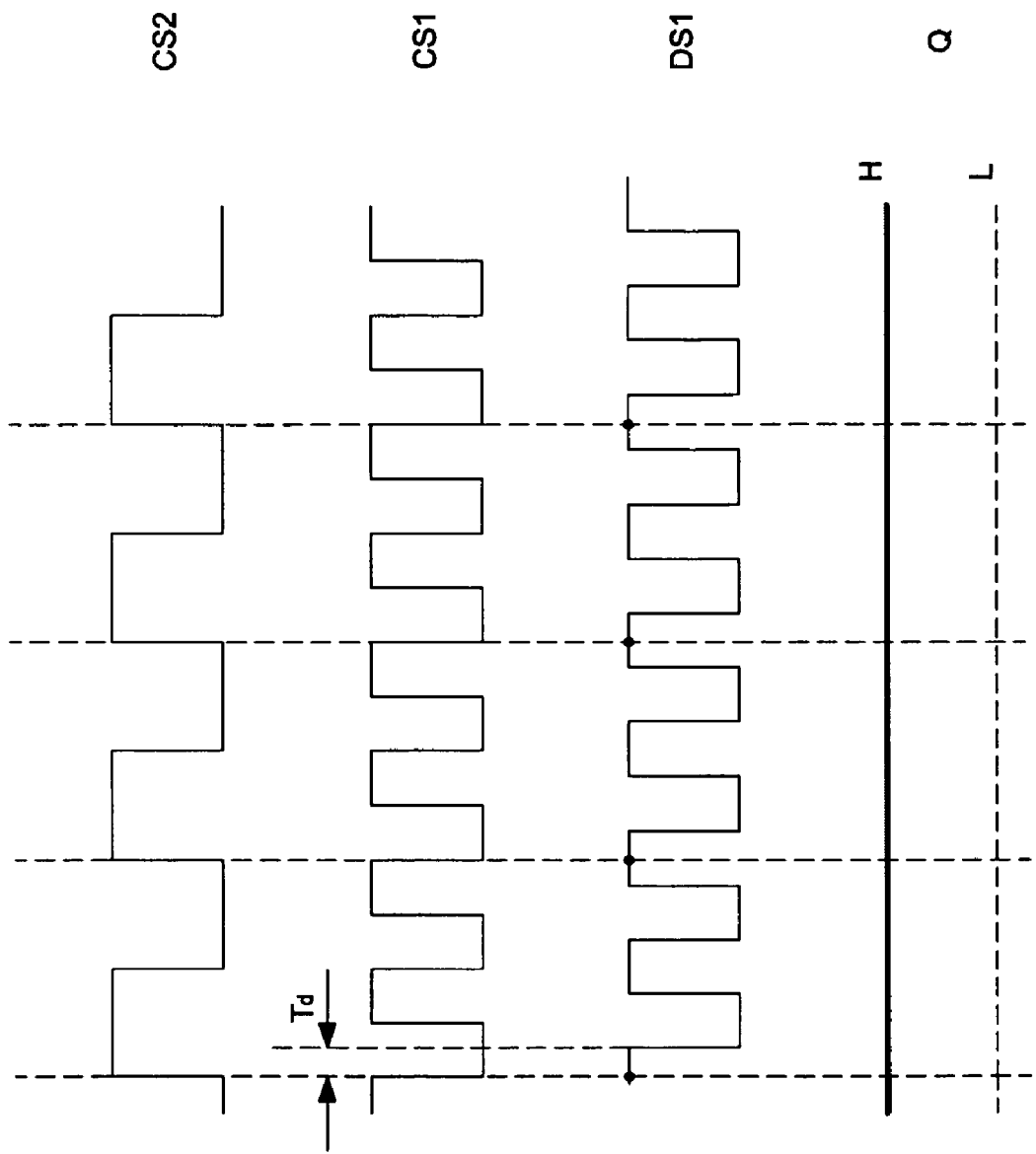

FIGS. 10A to 10D are schematic illustrations showing the waveforms in the detector in FIG. 9 of the invention when the information bit carried by the wobble signal is logic one, wherein FIG. 10A shows the second compared signal CS2, FIG 10B shows the first compared signal CS1, FIG. 10C shows the delayed signal DS1 obtained by delaying the first compared signal CS1 by a time period $T_d$, and FIG. 10D shows the sampled value Q output from the sampling unit. The time period $T_d$ in this example is $1/(8*f_{wob})$. In general, $T_d$ could be any positive number. Using the second compared signal CS2 as shown in FIG. 10A, the delayed signal DS1 can be properly sampled. From FIGS. 10A and 10C, no matter the sampling is performed based on the rising or falling edges of the second compared signal CS2, the sampled value Q output from the sampling unit could reflect the information carried by the wobble signal. In the example shown in FIGS. 10A to 10D wherein $T_d=1/(8*f_{wob})$, the sampled value Q is a hige level voltage, which represents the information bit of logic one. However, if one lets $T_d=3/(8*f_{wob})$, say, it is easy to find that the sampled value Q will be a low level voltage, which represents the information bit of logic one in this case. Once the $T_d$ is determined, whether the sampled value Q of high or low level voltage represents the information bit of logic one is also determined. In result, the information carried by the wobble signal can be detected according to the invention.

Figure 11:
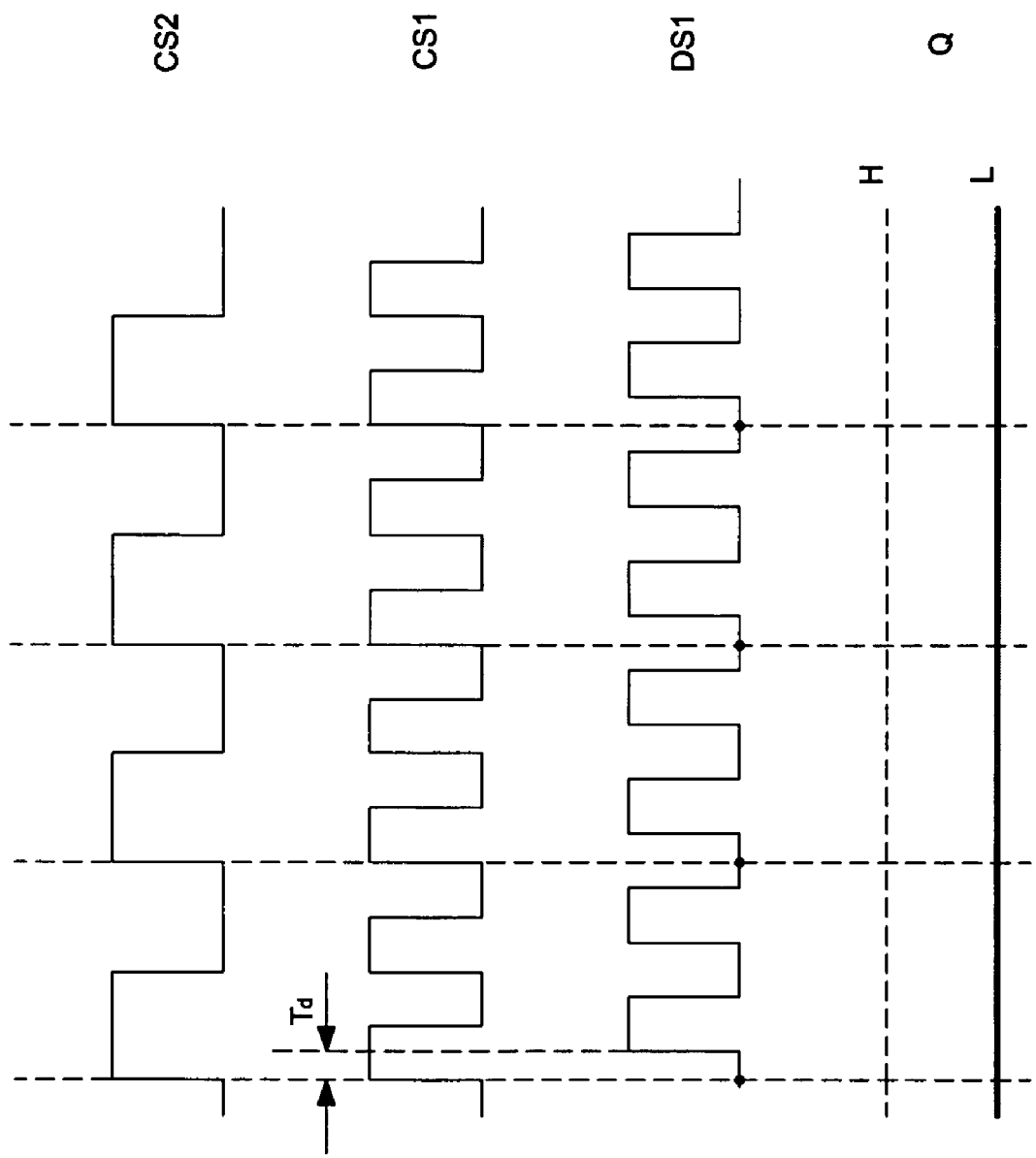
Figure 12:
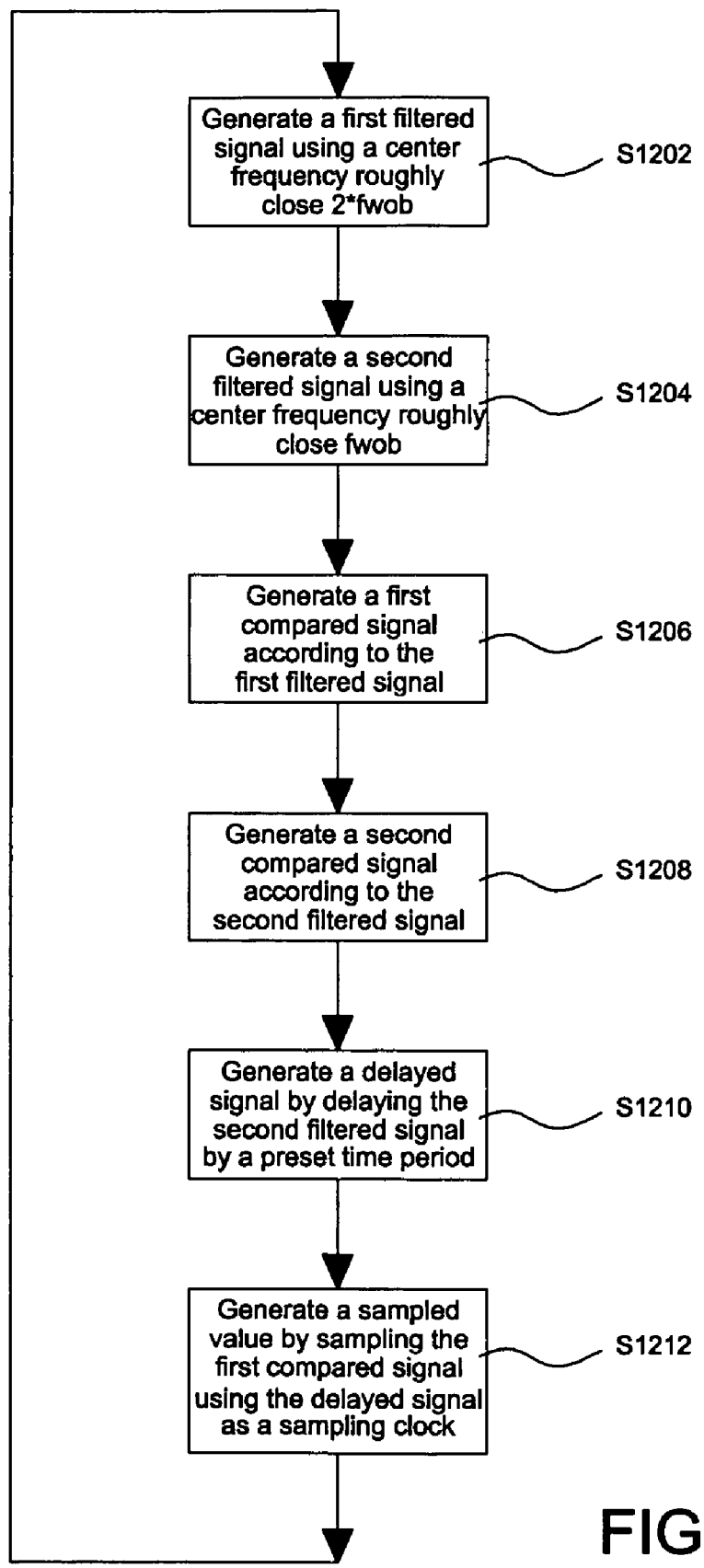
FIG. 12 shows a flowchart of a first method for detecting information carried by a sawtooth wobble according to the present invention.
Figure 13:
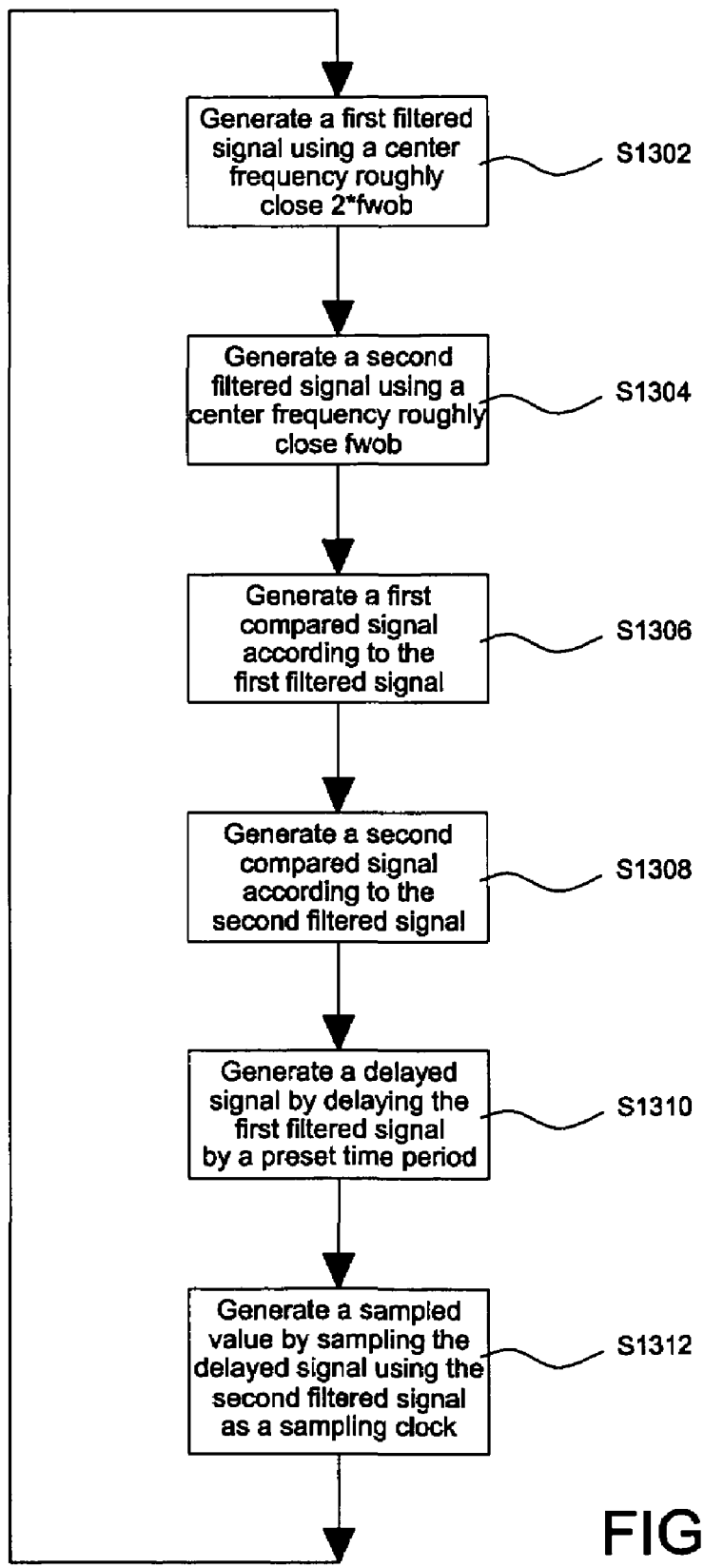
FIG. 13 shows a flowchart of a second method for detecting information carried by a sawtooth wobble according to the present invention.

FIGS. 11A to 11D are schematic illustrations showing the waveforms in the detector in FIG. 9 of the invention when the information bit carried by the wobble signal is logic zero, wherein FIG. 11A shows the second compared signal CS2, FIG. 11B shows the first compared signal CS1, FIG. 11C shows the delayed signal DS1 obtained by delaying the first compared signal CS1 by a time period $T_d$, and FIG. 11D shows the sampled value Q output from the sampling unit. The time period $T_d$ in this example is $1/(8*f_{wob})$. In general, $T_d$ could be any positive number. Similarly, using the second compared signal CS2 as shown in FIG. 11A, the delayed signal DS1 can be properly sampled. In the example shown in FIG. 11A to 11D wherein $T_d=1/(8*f_{wob})$, the sampled value Q is a low level voltage, which represents the information bit of logic zero. However, if one lets $T_d=3/(8*f_{wob})$, say, it is easy to find that the sampled value Q will be a low level voltage, which represents the information bit of logic zero in this case. Once the $T_d$ is determined, whether the sampled value Q of high or low level voltage represents the information bit of logic zero is also determined. In result, the information carried by the wobble signal can be detected according to the invention.

Followings are the steps of a second method for detecting information carried by a wobble signal having a sawtooth-like shape in the present invention. The wobble signal has a base frequency of $f_{wob}$. The method comprises:

Step S1302: generate a first filtered signal by band-pass filtering the wobble signal using a center frequency close to $2*f_{wob}$.

Step S1304: generate a second filtered signal by band-pass filtering the wobble signal using a center frequency close to $f_{wob}$.

Step S1306: generate a first compared signal by comparing the first filtered signal with a first reference voltage.

Step S1308: generate a second compared signal by comparing the second filtered signal with a second reference voltage. The first reference voltage and the second reference voltage may be substantially the same.

Step S1310: generate a delayed signal by delaying the first compared signal by a preset time period. The preset time period is less than $1/f_{wob}$ and equals to $N/(8*f_{wob})$, wherein N is an odd integer.

Step S1312: generate a sampled value representing the information carried by the wobble signal by sampling the delayed signal using the second compared signal as a sampling clock. The delayed signal can be sampled according to the rising or falling edges of the second compared signal to generate the sampled value.

While certain exemplary embodiments have been described and shown in the accompanying drawings, it is to be understood that such embodiments are merely illustrative of and not restrictive on the broad invention, and that this invention not be limited to the specific construction and arrangement shown and described, since various other modifications may occur to those ordinarily skilled in the art. detector for detecting information carried by a signal having a sawtooth-like shape, the detector comprising:

What is claimed is:

1. A detector for detecting information carried by a wobble signal having a sawtooth-like shape, the wobble signal having a base frequency of $f_{wob}$, the detector comprising:
   a first band-pass filter, which has a center frequency close to $2*f_{wob}$, for receiving and filtering the wobble signal and generating a first filtered signal;
   a second band-pass filter, which has a center frequency close to $f_{wob}$, for receiving and filtering the wobble signal and generating a second filtered signal;
   a first comparator for comparing the first filtered signal with a first reference voltage and generating a first compared signal;
   a second comparator for comparing the second filtered signal with a second reference voltage and generating a second compared signal;
   a delay unit for receiving the second compared signal, delaying the second compared signal by a preset time period, and then outputting a delayed signal; and
   a sampling unit for sampling the first compared signal using the delayed signal as a sampling clock, and outputting a sampled value representing the information carried by the wobble signal.

2. The detector according to claim 1, wherein the first reference voltage and the second reference voltage are substantially the same.

3. The detector according to claim 1, wherein the preset time period is less than $1/f_{wob}$.

4. The detector according to claim 1, wherein the sampling unit is triggered according to the rising edges of the delayed signal.

5. The detector according to claim 1, wherein the sampling unit is triggered according to the falling edges of the delayed signal.

6. The detector according to claim 1, wherein the preset time period equals to $N/(8*f_{wob})$, wherein N is an odd integer.

7. A detector for detecting information carried by a wobble signal having a sawtooth-like shape, the wobble signal having a base frequency of $f_{wob}$, the detector comprising:
   a first band-pass filter, which has a center frequency close to $2*f_{wob}$, for receiving and filtering the wobble signal and generating a first filtered signal;
   a second band-pass filter, which has a center frequency close to $f_{wob}$, for receiving and filtering the wobble signal and generating a second filtered signal;
   a first comparator for comparing the first filtered signal with a first reference voltage and generating a first compared signal;
   a second comparator for comparing the second filtered signal with a second reference voltage and generating a second compared signal;
   a delay unit for receiving the first compared signal, delaying the first compared signal by a preset time period, and then outputting a delayed signal; and
   a sampling unit for sampling the delayed signal using the second compared signal as a sampling clock, and outputting a sampled value representing the information carried by the wobble signal.

8. The detector according to claim 7, wherein the first reference voltage and the second reference voltage are substantially the same.

9. The detector according to claim 7, wherein the preset time period is less than $1/f_{wob}$.

10. The detector according to claim 7, wherein the sampling unit is triggered according to the rising edges of the second compared signal.

11. The detector according to claim 7, wherein the sampling unit is triggered according to the falling edges of the second compared signal.

12. The detector according to claim 7, wherein the preset time period equals to $N/(8*f_{wob})$, wherein N is an odd integer.

13. A method for detecting information carried by a wobble signal having a sawtooth-like shape, the wobble signal having a base frequency of $f_{wob}$, the method comprising:
- generating a first filtered signal by band-pass filtering the wobble signal using a center frequency close to $2*f_{wob}$;
- generating a second filtered signal by band-pass filtering the wobble signal using a center frequency close to $f_{wob}$;
- generating a first compared signal by comparing the first filtered signal with a first reference voltage;
- generating a second compared signal by comparing the second filtered signal with a second reference voltage;
- generating a delayed signal by delaying the second compared signal by a preset time period; and
- generating a sampled value representing the information carried by the wobble signal by sampling the first compared signal using the delayed signal as a sampling clock.

14. The method according to claim 13, wherein the first reference voltage and the second reference voltage are substantially the same.

15. The method according to claim 13, wherein the preset time period is less than $1/f_{wob}$.

16. The method according to claim 13, wherein the sampling step is performed according to the rising edges of the delayed signal.

17. The method according to claim 13, wherein the sampling, step is performed according to the falling edges of the delayed signal.

18. The method according to claim 13, wherein the preset time period equals to $N/(8*f_{wob})$, wherein N is an odd integer.

19. A method for detecting information carried by a wobble signal having a sawtooth-like shape, the wobble signal having a base frequency of $f_{wob}$, the method comprising:
- generating a first filtered signal by band-pass filtering the wobble signal using a center frequency close to $2*f_{wob}$;
- generating a second filtered signal by band-pass filtering the wobble signal using a center frequency close to $f_{wob}$;
- generating a first compared signal by comparing the first filtered signal with a first reference voltage;
- generating a second compared signal by comparing the second filtered signal with a second reference voltage;
- generating a delayed signal by delaying the first compared signal by a preset time period; and
- generating a sampled value representing the information carried by the wobble signal by sampling the delayed signal using the second compared signal as a sampling clock.

20. The method according to claim 19, wherein the first reference voltage and the second reference voltage are substantially the same.

21. The method according to claim 19, wherein the preset time period is less than $1/f_{wob}$.

22. The method according to claim 19, wherein the sampling step is performed according to the rising edges of the second compared signal.

23. The method according to claim 19, wherein the sampling step is performed according to the falling edges of the second compared signal.

24. The method according to claim 19, wherein the preset time period equals to $N/(8*f_{wob})$, wherein N is an odd integer.

* * * * *